United States Patent
Perner

(10) Patent No.: US 11,742,048 B2
(45) Date of Patent: Aug. 29, 2023

(54) METHOD FOR TESTING MEMORY

(71) Applicant: Infineon Technologies AG, Neubiberg (DE)

(72) Inventor: Martin Perner, Munich (DE)

(73) Assignee: Infineon Technologies AG, Neubiberg (DE)

(*) Notice: Subject to any disclaimer, the term of this patent is extended or adjusted under 35 U.S.C. 154(b) by 26 days.

(21) Appl. No.: 17/387,189

(22) Filed: Jul. 28, 2021

(65) Prior Publication Data
US 2022/0059180 A1    Feb. 24, 2022

(30) Foreign Application Priority Data

Jul. 31, 2020   (DE) .................... 10 2020 120 335.7

(51) Int. Cl.
| | |
|---|---|
| *G11C 29/42* | (2006.01) |
| *G11C 29/10* | (2006.01) |
| *G11C 29/18* | (2006.01) |
| *G11C 29/46* | (2006.01) |

(52) U.S. Cl.
CPC .............. *G11C 29/42* (2013.01); *G11C 29/10* (2013.01); *G11C 29/18* (2013.01); *G11C 29/46* (2013.01)

(58) Field of Classification Search
None
See application file for complete search history.

(56) References Cited

U.S. PATENT DOCUMENTS

| | | | |
|---|---|---|---|
| 8,352,813 B2* | 1/2013 | He | G11C 29/36 714/720 |
| 8,374,026 B2 | 2/2013 | Sharon | |
| 2013/0173970 A1* | 7/2013 | Kleveland | G06F 11/2094 714/710 |
| 2017/0213601 A1* | 7/2017 | Shao | G06F 11/27 |
| 2019/0311775 A1* | 10/2019 | Kwon | G11C 16/3472 |

FOREIGN PATENT DOCUMENTS

DE    102013202865 A1 *  8/2014    .......... G06F 11/073

* cited by examiner

*Primary Examiner* — April Y Blair
*Assistant Examiner* — Matthew W Wahlin
(74) *Attorney, Agent, or Firm* — Eschweiler & Potashnik, LLC

(57) ABSTRACT

A method for testing a memory area. The method includes jumping from a destination address to a source address, reading a data word at the source address after jumping to the source address, and examining the data word. The source address was determined based on a static test.

19 Claims, 4 Drawing Sheets

METHOD FOR TESTING MEMORY

REFERENCE TO RELATED APPLICATION

This application claims priority to German Application No. 10 2020 120 335.7, filed on Jul. 31, 2020, the contents of which are hereby incorporated by reference in their entirety.

FIELD

The disclosure relates to an approach for testing a memory area.

BACKGROUND

Memory tests can lead to different errors under different conditions.

SUMMARY

The present disclosure relates to an approach to checking a memory area with improved efficiency. Combinations of the features that follow can be used. Features of a method can be combined with features of an apparatus, or vice versa.

Embodiments of the present disclosure relate to a method for testing a memory area in which a jump from a destination address back to a source address is made, in which after the jump back to the source address a data word at the source address is read, and in which the data word that is read is examined, wherein the source address was determined on the basis of a static test.

The memory area can be part of a memory. The memory can have one or more memory areas. The memory area can be distributed over one or more memories.

In one embodiment, the source address is determined on the basis of the static test by using only source addresses for which the static test has revealed that there is no erased data word present at the respective source address.

In one embodiment, the static test at the source address has revealed that the data word read there was correct.

In one embodiment, the data word that is read is examined by means of error detection and it is determined whether the data word that is read is correct, has a correctable error or has an uncorrectable error.

The correctable error can—depending on the error code used—be a correctable 1-bit error, a correctable 2-bit error or another correctable multibit error. The uncorrectable error is for example a multibit error that, although detectable by means of the error code used, is not correctable.

In one embodiment, the jump is made from the source address to the destination address and back to the source address.

In one embodiment, the data word that is read is examined by determining whether the data word is a code word of an error code.

The error code is an error-detecting and/or error-correcting code. The error code comprises a set of code words. If the data word that is read is a code word, then the check reveals that no error was detected. Conversely, an error is present if the data word that is read is not a code word of the error code.

In one embodiment, the data word that is read is examined and a dynamic error state of the data word that is read is determined.

In one embodiment, the static test for the words in the memory area is used to determine a static error state.

An error state (regardless of whether it is a static error state or a dynamic error state) of the data word can indicate whether the data word was detected correctly, whether it has a correctable error or an uncorrectable error. It is also possible for the error state to indicate what type of correctable error is present, e.g. a correctable 1-bit error, a correctable 2-bit error, etc.

In one embodiment, the data word stored at the source address has a predefined static error state.

Accordingly, it is possible to filter the source address according to additional criteria. By way of example, source addresses that have one or more specific static error states can be used for the test. By way of example, only source addresses that, based on the static test, contain either a correct data word or an erroneous but correctable data word can be used.

In one embodiment, the static error state and the result of the static test for whether a word at an address in the memory area is an erased word or not an erased word are entered in a map.

In one embodiment, the method is carried out on the basis of the information stored in the map.

In one embodiment, the result of the method is entered in the map.

In one embodiment, the test is carried out for multiple or for all words in the memory area and the test is taken as a basis for determining a state of the memory area.

The state of the memory area can be used as an indicator of the current quality or the period of use that can be expected.

In one embodiment, a test or multiple tests is/are taken as a basis for producing a forecast for the change in the state of the memory area.

By way of example, the state can be used to forecast whether and, if appropriate, when a memory area reaches or drops below a predefined threshold of reliability, i.e. a specific predefined deterioration in the memory area occurs. This means that a suitable measure can be initiated in good time before the critical state is reached, e.g. the memory area can be reprogrammed, refreshed, replaced or a component having the memory area can be restored. This is in particular advantageous for security-relevant applications.

It is also possible for the check on the state of the memory area, for example before an update that is to be performed or that has been performed goes live, to ensure that the memory area works reliably. This is in particular advantageous in association with frequent updates, which e.g. are increasingly performed via the air interface in the automotive sector (SOTA).

In one embodiment, the state of the memory area or a change in the state of the memory area is taken as a basis for initiating a predefined measure.

The measure can comprise: repair of the memory area; replacement of the memory area; deactivation of the memory area; replacement of the device that comprises the memory area; sending of an alert message; and shutdown of the application using the memory area.

In one embodiment, multiple destination addresses are used as jump destinations for each source address.

In one embodiment, the destination address is determined by inverting at least one bit of the source address.

In one embodiment, the destination address is an address at which an unerased word is stored.

In one embodiment, the test is carried out for multiple source addresses in the memory area.

An apparatus is also proposed for testing a memory area, which is designed to carry out the steps of: making a jump from a destination address back to a source address, wherein after the jump back to the source address a data word at the source address is read; and examining the data word that is read, wherein the source address was determined on the basis of a static test.

In one embodiment, the apparatus comprises a memory, wherein the memory comprises the memory area.

In one embodiment, a computer program product that is able to be loaded directly into a memory of a digital computer comprises program code parts suitable for carrying out steps of the method described here.

Additionally, the aforementioned challenges may be addressed by means of a computer-readable storage medium, e.g. any memory, comprising computer-executable instructions (e.g. in the form of program code) suitable for prompting the computer to carry out steps of the method described here.

The above-described properties, features and advantages and the way in which they are achieved are explained further in association with the following schematic description of example embodiments, which are explained in greater detail in association with the drawings. In this case, identical or identically acting elements may be provided with identical reference signs for the sake of clarity.

DESCRIPTION

Figure 1:
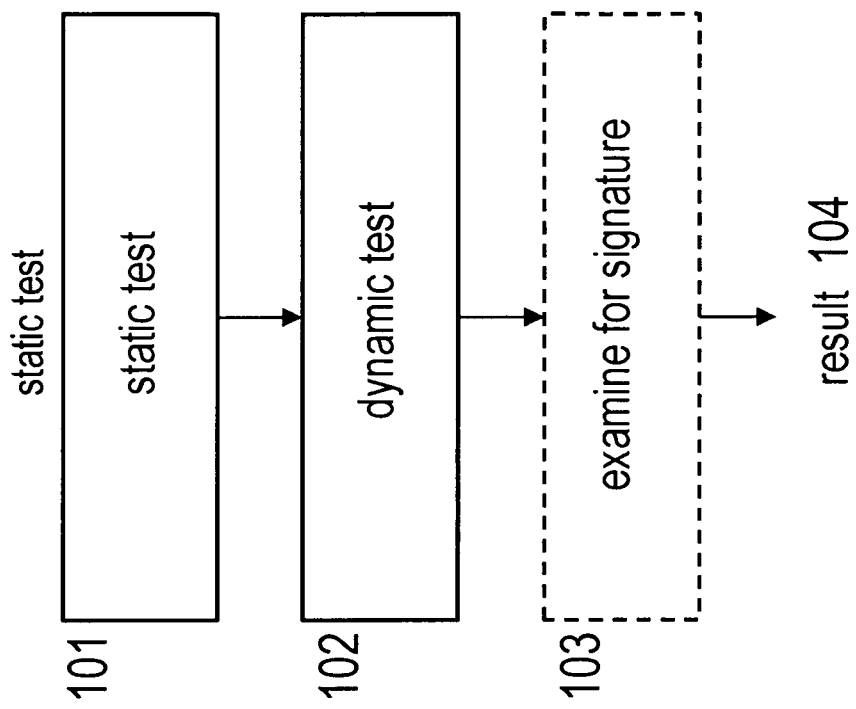
FIG. 1 shows a schematic chart with steps for testing a memory.

A nonvolatile memory (NVM) can be programmed by a user. By way of illustration, it is assumed that the memory contains words having a predefined number of bits, a predefined number of words being able to be stored per page of the memory. A memory area can contain erased and/or written words as the result of the programming. The memory can comprise one or more memory areas. A memory area can also be distributed over multiple physical or logical memories. The memory area can therefore be a coherent memory area or a distributed memory area.

The length of the word (also referred to as word length) often determines a memory size on the basis of which error correction is performed. An error correction code (ECC) is therefore in particular applied on the basis of a word or at least one word. By way of example, a word can correspond to a code word of an error code if there is no error. If the word is not a code word of this error code, then a detectable and possibly correctable error is present. In particular, the word can comprise at least one check bit that can be used to detect and/or correct at least one error in the word. By way of example, there can be provision for an error code that permits errors in a word to be detected and both 1-bit errors and 2-bit errors to be corrected. Furthermore, there can also be multibit errors, which the error code cannot detect.

After the memory area has been erased, the words contained therein are erroneous for the error correction code, since they are unwritten and therefore also contain no valid check bits, or the individual bits of the word that is read are not a code word of the error code.

The memory or memory area can comprise both erased words and programmed words. The programmed words can be correct or erroneous.

There is the possibility of erroneous words being programmed intentionally. These are systematic errors in order to check the function of error detection and/or error correction. In particular, it is an option for systematic errors to comprise at least one word that is not a code word. The systematic error also has a signature comprising at least one word that is not a code word. By way of example, a series or (also interrupted) collection of words can be such a signature. If an error is detected, it is additionally possible to examine whether this error is part of a signature. If this is the case, the error is classified as a systematic error. During assessment of the state of the memory area, such systematic errors can be masked out and therefore the quality of the memory can be assessed on the basis of the actually determined errors (if appropriate, also taking into consideration a change in such errors over time) without such systematic errors. If a user has programmed systematic errors intentionally, these systematic errors can be ignored or masked out during the assessment of the freedom of the memory area from error and/or the quality of the memory area.

By way of example, the memory area can be part of a microcontroller that performs functions predefined in a customer application. Such a memory is intended to be checked for errors without the content of said memory or the function of any programmed parts being known or needing to be known.

The check is intended to allow for example single-bit errors based on cell array aging to be detected.

The result of the check can be used for repairing the memory area, for example by using correct areas instead of erroneous areas. After the repair, a test on the memory area can be carried out again and the freedom of the chip (e.g. microcontroller) from error can be confirmed if appropriate.

Advantageously, the approach described here can be used to determine both a slow change and an abrupt deterioration in the memory.

It is an option for the check to be carried out after an update on the memory area, e.g. in order to confirm freedom from error after an update. The update can be an update for the data and/or programs via the air interface (SOTA: Software/Firmware Update Over-the-Air).

The examination software can be pre-installed on a nonvolatile memory or an area of a nonvolatile memory, for example. For performance of the test, this software can be loaded into a different (volatile or nonvolatile) memory area in order to carry out the check on the nonvolatile memory (or part thereof) from there during operation in parallel with the actual application.

By way of illustration, a scenario is described in which a check on a nonvolatile memory is intended to be carried out by means of a processor unit (CPU: Central Processing Unit). The nonvolatile memory area can extend over one physical memory chip or over multiple physical memory chips. Accordingly, the approach described here can be used to examine multiple memory areas.

By way of example, the processor unit has two associated volatile memories (RAM: Random Access Memory), in particular as static volatile memories (SRAM: Static RAM), one as SRAM for data (DSRAM) and one as SRAM for program code (PSRAM). Such an architecture is employed in microcontrollers, for example.

The checking program can be loaded into the PSRAM and, when executed, collects information that it stores in the DSRAM.

By way of example, the checking program can be precompiled and loaded into the PSRAM as binary code by a bootloader. One option is for the precompiled program to be loaded into the PSRAM in encrypted form and only decrypted there, or to decrypt itself prior to execution. In particular, it is an option for the program to be certified or for a certificate of the program to be checked prior to execution.

One option is also for multiple programs to be executed in parallel, e.g. in different threads and/or on different processor units. It is therefore possible to check at least some memory areas simultaneously and thus to speed up the checking of the memory.

The check, e.g. on unused memory areas, can also take place while the useful program is running, i.e. during the operation of the application.

FIG. 1 shows a schematic chart with steps for testing a memory, in particular a memory of a microcontroller or a memory that can be used by a processing unit.

By way of illustration, the test takes place in at least one memory area. The memory area can be a part of a physical memory or the entire physical memory. The memory area is divided into words. The test takes place on the basis of one single stored word. Preferably, one word is addressed per address. The word can comprise data bits and check bits. The check bits are check bits of the error code. The error code can be a code that can detect and/or correct errors. The error code comprises code words indicating that there is no error present. In this respect, the words stored in the memory are in particular code words if there is no error present. If the word is different than a code word of the error code, there is at least one detectable and/or correctable error of the error code present. Any error codes are possible as the error code, e.g. Hamming codes, BCH codes, Berger codes or Hsiao codes.

In a step 101, a static test on the words in the memory area takes place. This also ascertains which words are erased and which are unerased. As the result of the static test, it is thus known for the words in the memory area which word is erased and which word is unerased (i.e. programmed). Furthermore, in an example where an error state is known, it is known whether, per unerased word: the word is erroneous; the word is correct (if no error was detected in the word); a correctable error was present; or an uncorrectable error was present.

Those words that either are correct or have correctable errors are referred to as "ECC PASS words", for example (that is to say as words for which there was no uncorrectable error present).

Alternatively, it may also be advantageous to mark words that comprise uncorrectable errors as "ECC PASS" if these uncorrectable errors are intentionally inserted (e.g. programmed) errors.

Accordingly, it is also an option for an intentionally programmed error—irrespective of whether it is correctable or uncorrectable—to be detected as such e.g. by carrying out a comparison with a signature that comprises at least one word having an intentionally programmed error. Such a signature thus corresponds to an error pattern that can be detected and allows an intentionally programmed error to be inferred. The intentionally programmed error is not an error that indicates a physical deterioration in the memory area. It is thus advantageous for the intentionally programmed errors to be detected as such and for the associated words to be classified as ECC PASS, the deterioration in the memory area then being determined on the basis of those words that are not ECC PASS.

By way of example, correctable errors can be categorized as tolerable during the assessment of the state of the memory area. Alternatively, it is an option for the assessment of the state of the memory area to take into consideration the increase in correctable errors and therefore for a more precise statement about an increasing deterioration in the memory area to be able to be made. As such, for example a memory that is still working correctly could have a large number of correctable errors that increases with every test. It is therefore possible to forecast that the rising number of (correctable) errors means that uncorrectable errors will also occur shortly, which are possibly problematic. Ultimately, the increase in the number of correctable errors can therefore be an alert signal to take measures early in order to counter the imminent failure of the memory area.

For the unerased words, error correction is switched on in order to determine the error state. The information determined in step 101 can be stored in a map: by way of example, the map comprises one entry per word indicating whether the word is erased/unerased and—if the word is unerased—showing the error state thereof.

In a subsequent step 102, a dynamic test is carried out using this map. Only those words that were previously determined as "unerased" are tested. A dynamic jump is made between two addresses in the memory area, and error correction switched on or switched off is used to determine whether there is an error present that had not previously occurred during the static test. In other words, the dynamic test ascertains additional errors that occur only when a dynamic jump was made between addresses immediately before the reading.

Alternatively, the dynamic test can also be carried out without the map. In this case, it is previously determined which words in the memory area are used (unerased).

By way of example, the dynamic test can be carried out for the ECC PASS words. The dynamic test can be carried out for all words or for some of the words.

An illustrative selection of possible dynamic tests is described in more detail below.

It is also an option for the erroneous words to be compared with a predefined signature in a step 103 in order to determine whether at least one intentionally erroneous word was stored (in this regard, see the explanations above). In some embodiments, step 103 takes place only statically, that is to say can also be carried out between steps 101 and 102 and can optionally be based on the result of the static test.

The test shown in FIG. 1 delivers a result 104 that can be used to assess whether the tested memory area is erroneous or to assess whether there are correctable and/or uncorrectable errors and—taking into consideration past tests—to determine a change in the error behavior of the memory area. By way of example, it is therefore possible to produce a forecast for when the memory area will probably no longer be usable or when a physical memory should be replaced.

Figure 2:
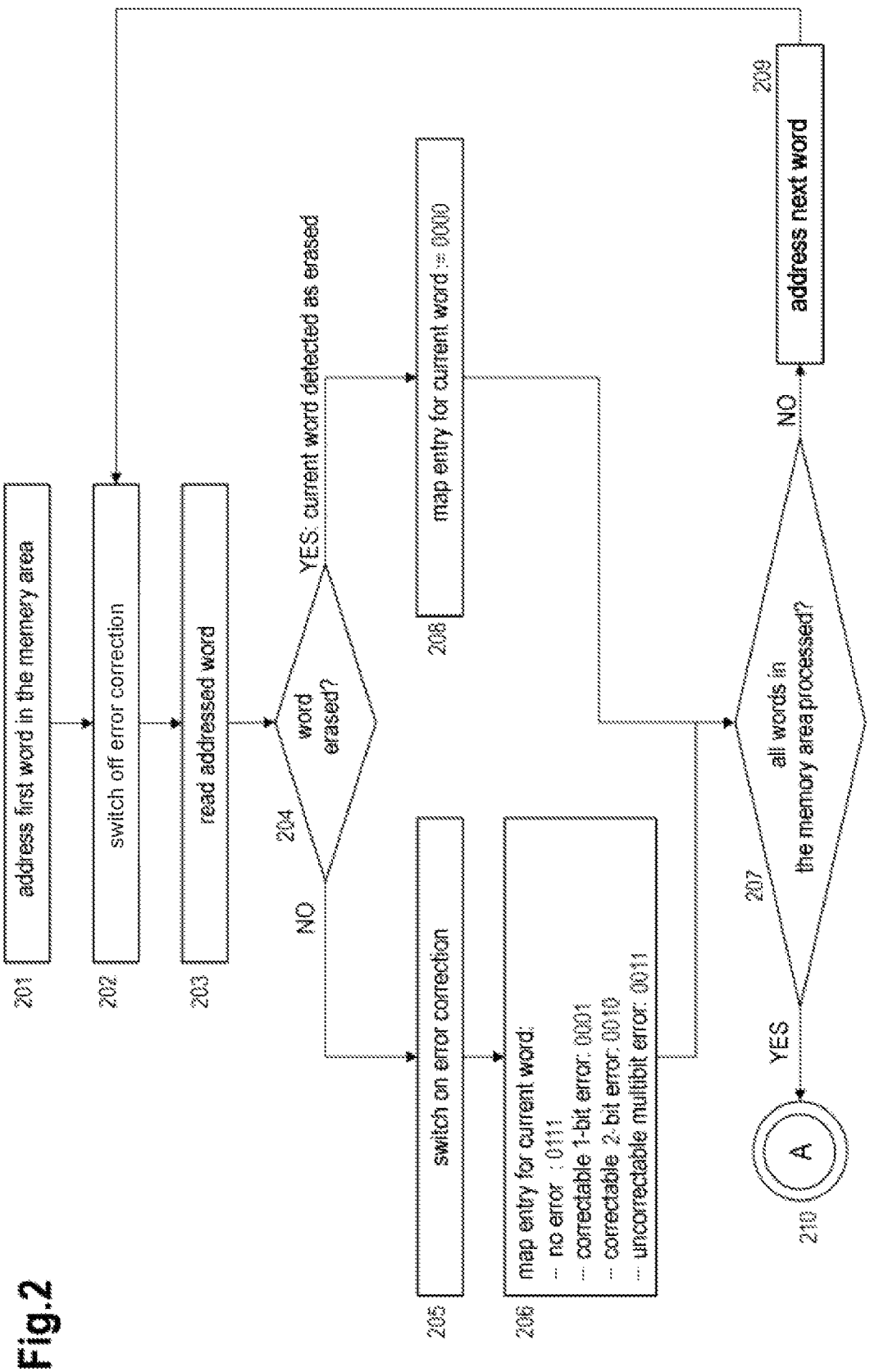
FIG. 2 shows a schematic chart to illustrate an illustrative static test.

FIG. 2 shows a schematic chart to illustrate an illustrative static test. As explained above, a memory area is supposed to be tested. The static test firstly delivers the information regarding which words are used (in particular readably) by the program or the data and which words are unused (erased). Secondly, the result determined for the static test is whether the used words are correct or are (correctably or uncorrectably) erroneous.

Additionally, it will be noted that individual words can also be protected, and in that case excluded from the test described here, in particular with regard to read access. It is possible for the memory area to have at least one such protected word.

Figure 4:
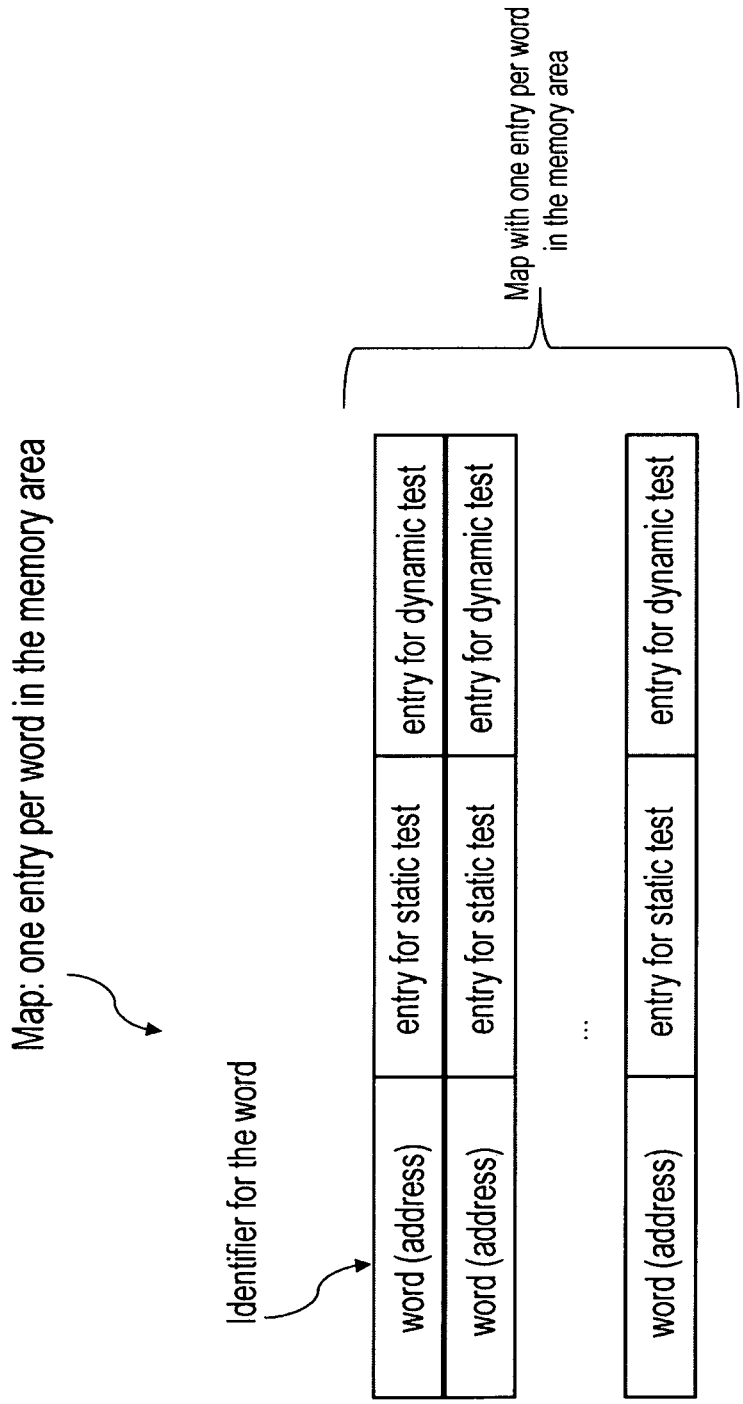
FIG. 4 shows a schematic diagram of an illustrative map for the memory area.

The model used for the memory is a map that has an entry for each word in the memory area. Details concerning the map are shown in FIG. 4. The entries in the map for the static test are determined by means of the steps shown below:

Step 201: A first word in a memory area is addressed.
Step 202: Error correction is switched off.
Step 203: The addressed word is read.
Step 204: It is determined whether the word that is read is an erased word. If the word that is read was detected as erased, the process branches to step 208. If the word that is read is not an erased word, on the other hand, the process branches to step 205.

By way of example, a word is detected as erased if the payload data and the bits intended for error correction all have the value 0. In this example, the value 0 corresponds to the logic erased state of the bit. Alternatively, the value 1 could correspond to the logic erased state of the individual bit. There can also be provision for bit patterns that represent an erased state. Preferably, an erased word has a bit pattern that has a large code distance from the code words of the error code, which means that distortion of the bit pattern of an erased word into a code word is as improbable as possible.

Step 205: Error correction is switched on.
Step 206: The error correction is used to determine whether the word that is read is correct or has at least one (possibly correctable) error. In the example chosen here, the map entry for the word that is read is written as follows: if the word that is read is correct, a value "0111" is set; if there is a correctable 1-bit error, a value "0001" is set; if there is a correctable 2-bit error, a value "0010" is set, and if there is an uncorrectable multibit error, the value "0011" is set. The above values are binary values by way of illustration.

Step 207: A test is performed to determine whether all words in the memory area were processed. If all words in the memory area were processed, the process branches to the subsequent dynamic test (see step 210), otherwise the process branches to step 209.

Step 209: The next word is addressed and the process skips to step 202.

Step 208: Since the word that is read was detected as erased, the map entry for this word is set to a value "0000" (4-bit binary) by way of illustration and the process skips to step 207.

The result of the steps carried out in FIG. 2 thus yields, for the processed memory area, a map that has at least one entry per word in the memory area. In the example chosen, the entry per word is a 4-bit value indicating whether the word in the memory area was detected as erased or was not detected as erased. Additionally, the 4-bit value indicates whether, if the word in the memory area was detected as unerased, a correct word was read or an erroneous word that is correctable or uncorrectable was read.

Additionally, the 4-bit value also indicates what type of correctable error was involved. In this context, it will be noted that the bit combinations shown are examples. In principle, any codings can be chosen in order to store information about the respective word in the map. By way of example, with k bits, k criteria or 2k criteria can be stored.

The static test shown in FIG. 2 is followed (directly or indirectly) by a dynamic test in order to determine the extent to which fast and possibly disordered memory access to the words in the memory area can lead to errors. In some embodiments, only the words that were not previously detected as erased are addressed in the dynamic test. In order to address the words, the map can be used in the dynamic test. By way of example, said map quickly reveals which words in the memory area are "erased" and which are "unerased".

The static test advantageously delivers a preselection that can be used for the dynamic test (also referred to as performance test or address transition performance test). The dynamic test checks whether a word previously read correctly in the static test is then read erroneously after an applicable address jump has taken place (which e.g. has brought about a selection and deselection). Preferably, address jumps that lead to changes in the occupancy of the word line and/or bit line of the address decoder can be taken into consideration.

Figure 3:
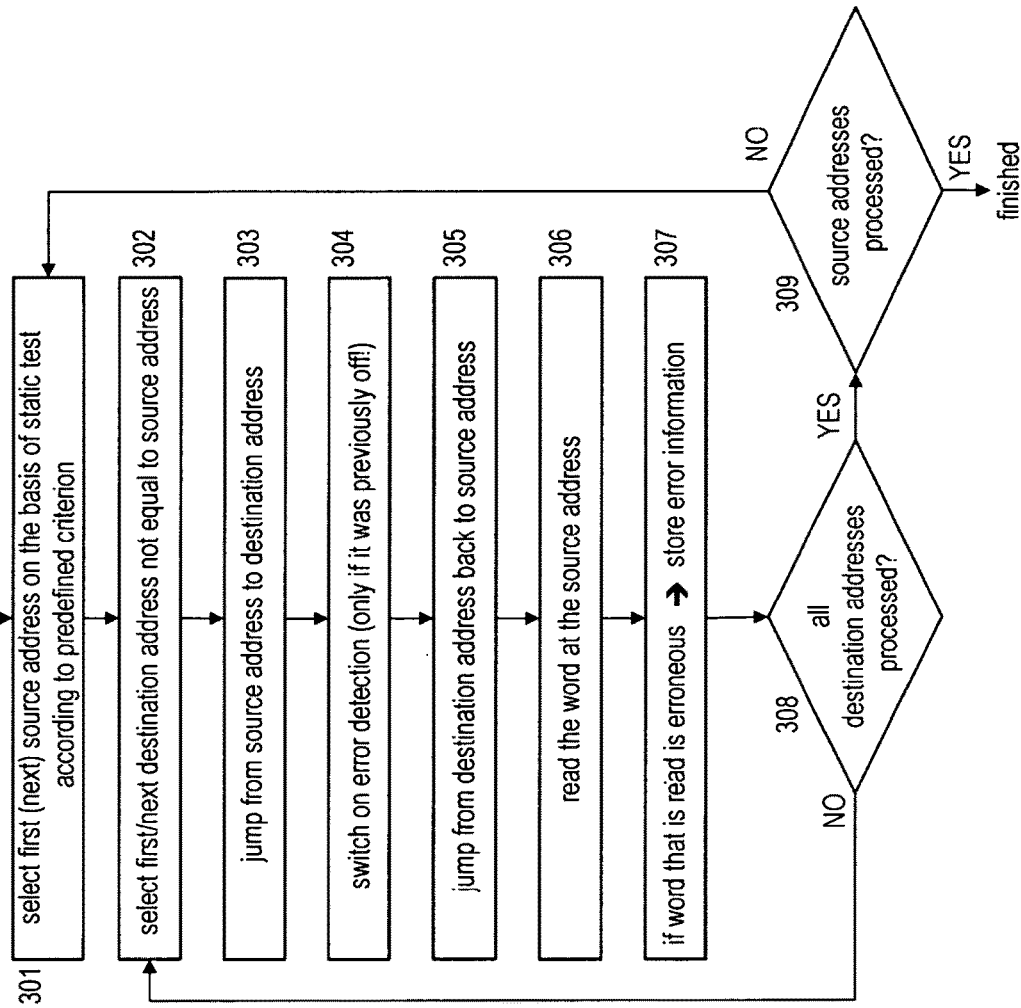
FIG. 3 shows a schematic chart to illustrate an illustrative dynamic test. In some embodiments, only those entries in the memory area that were previously determined as "unerased" are tested.

FIG. 3 shows a schematic chart to illustrate an illustrative dynamic test. In some embodiments, only those entries in the memory area that were previously determined as "unerased" being tested.

The lead-in to the dynamic test is step 210, which, by way of illustration, previously marked the conclusion of the static test in FIG. 2. By way of illustration, the dynamic test comprises the following steps:

Step 301: The first or next source address is chosen. The choice of source address is based on the results of the static test carried out previously, for example by virtue of only source addresses whose entries were previously detected as "unerased" being possible.

Additionally, the filtered source addresses can be selected according to a criterion: by way of example, the criterion determined can be to use only source addresses whose entries have no error, one (correctable) error, two (correctable) errors or multiple (uncorrectable) errors. According to the example above, a filter can therefore be applied to entries in the map. If the filter has the 4-bit value "0010", then only source addresses whose words showed a correctable 2-bit error in the static test are used. Combinations of criteria are also possible for selecting the source addresses.

Step 302: A first or next destination address that is not equal to the source address is chosen. The destination address can be selected using different approaches.

By way of example, the destination addresses used can be only addresses whose entries are filtered according to the map, e.g. only entries whose words had no error ("0111") in the static test.

An alternative or additional variant for selecting the destination address can involve the source address: by way of example, the destination address can be determined by modifying at least one bit of the source address. As such, the source address can be Exclusive-Ored (XORed) with a mask in order to obtain the destination address. It is also possible for multiple masks to be used. By way of example, a multiplicity of destination addresses can be determined for a source address as follows: if the source and destination addresses each have n bits, then n destination addresses can be determined for a source address by using n different masks, each mask having a "1" in one position and the remainder being "0". The destination address is obtained by XORing the source address with each of the masks.

If the number of bits is n=8, then the following masks and destination addresses are obtained, according to this example, for an assumed source address "0110 1101":

| Mask | Source address XOR mask = destination address |
| --- | --- |
| 0000 0001 | 0110 1101 XOR 0000 0001 = 0110 1100 |
| 0000 0010 | 0110 1101 XOR 0000 0010 = 0110 1111 |

| Mask | Source address XOR mask = destination address |
| --- | --- |
| 0000 0100 | 0110 1101 XOR 0000 0100 = 0110 1001 |
| 0000 1000 | 0110 1101 XOR 0000 1000 = 0110 0101 |
| 0001 0000 | 0110 1101 XOR 0001 0000 = 0111 1101 |
| 0010 0000 | 0110 1101 XOR 0010 0000 = 0100 1101 |
| 0100 0000 | 0110 1101 XOR 0100 0000 = 0010 1101 |
| 1000 0000 | 0110 1101 XOR 1000 0000 = 1110 1101 |

This approach involves the individual bits of the source address being inverted.

It is also possible for the mask to have the value "1" at more than one position and therefore for more than one bit of the source address to be inverted.

Step 303: A jump is made from the source address to the destination address.

Step 304: Error detection is switched on (if it was previously switched off, otherwise it remains switched on).

Step 305: A jump is made from the destination address back to the source address.

Step 306: The word at the source address is read.

Step 307: It is determined whether the word that is read at the source address is erroneous. Optionally, the error state can be stored. By way of example, the error state indicates whether during the dynamic test the word that was read was correct or had a correctable 1-bit error, a correctable 2-bit error, or an uncorrectable multibit error.

By way of example, the error state determined is the worst state, which is stored in the map in the following order (prioritization): uncorrectable multibit error, correctable 2-bit error, correctable 1-bit error, no error.

Step 308: A test is performed to determine whether all destination addresses were processed for the predefined source address. If not all destination addresses were processed yet, the process branches back to step 302 and the next destination address is selected. If all destination addresses were processed for this source address, the process is continued at step 309.

Step 309: A test is performed to determine whether all source addresses were processed. If not all source addresses were processed yet, the process branches back to step 301 and the next source address is selected. If all source addresses were processed, the process is terminated.

One option is for a list of possible destination addresses to have been determined for this source address (and possibly also for other source addresses) before step 302. This list of destination addresses is then processed for the respective source address. By way of example, it is advantageous that an error bit is erased before the list is processed, and the error bit is set for the source address at the end if an error has occurred in the course of processing of the address sequence. One error bit per error type can be used or a single error bit can be used that indicates whether an uncorrectable error was detected after the address sequence was processed.

In principle, there are a multiplicity of opportunities for storing and/or evaluating the information obtained regarding the error states. In particular, it is possible to determine a change over time by storing the results of the individual tests (e.g. for a predefined period or without a time limit), as a result of which a forecast in respect of the deterioration in the memory area is possible by means of extrapolation of the existing results.

It is also an option for at least some of the destination addresses to be determined randomly or pseudo-randomly. The destination addresses can additionally be part of the valid addresses of the memory area. Furthermore, the destination addresses can be restricted to addresses that contain no erased words. Finally, the destination addresses can also be restricted to addresses that contain only erased words.

In principle, source addresses and destination addresses can be restricted to (coherent or noncoherent) parts of the memory area. Such a restriction can be based on at least one criterion. The restrictions can be different for the source addresses and the destination addresses and/or can be based on different criteria.

Another option is for error detection to be switched off before a jump is made to the destination address in step 303. This prevents the jump to the destination address (and possibly an associated read operation for the word stored at the destination address) from prompting a possibly erroneous word at the destination address to influence the state of the error detection. According to the approach described here by way of illustration, the error detection is supposed to indicate the error state of the word that is read at the source address and not the error state of the word that is present at the destination address, of course.

FIG. 4 shows a schematic diagram of an illustrative map for the memory area. A field "Word (address)" is an identifier for an entry, here a word, in the memory area. There is thus one identifier for each word in the memory area. By way of example, the identifier can contain an address or a piece of information linked to the address.

If a coherent (linear) memory area is involved, the identifier could be dispensed with as part of the map if a link between the words in the memory area and the map entries, e.g. as a result of the order of the map entries, is explicitly possible.

In the example shown in FIG. 4, there are two entries per entry in the memory area (that is to say per identifier): one entry for the static test and one entry for the dynamic test. In the example shown in FIG. 4, these together with the identifier are a row of the map.

The map can therefore comprise a matrix representation with row-by-row entries, information about one word in the memory area being filed per row.

The entry for the static test can be the above-described state or error state that was ascertained during the static test. The error state from the dynamic test is filed with the entry for the dynamic test.

After the tests are carried out, the map therefore delivers one piece of information about the result of the static and dynamic tests per entry in the memory area. A statement regarding the quality of the tested memory area is possible on the basis thereof.

The map can comprise further entries (not depicted in FIG. 4), which permits the change in the error states to be recorded, as a result of which a trend or a gradual change (deterioration) in the memory area can be determined. On the basis of such a trend, a suitable measure, e.g. replacement of the memory or the device in which the memory is arranged, can also be taken in good time before failure.

The map can be extended as appropriate by storing a multiplicity of values per word. In particular, information from multiple or all tests carried out can be stored. The test result can also be stored for every possible error state or for some of the error states.

As described above, a detected error can be a systematic error that, by way of example, was programmed intentionally and is detectable as such on the basis of its programmed signature. The systematic error is thus not an error that permits inferences regarding the deterioration in the memory area. The systematic error is a separate error category that can be stored accordingly in the map.

Additionally, the map can also be used to detect systematic errors. If a signature has five successive erroneous words, for example, then the first four words are determined to be erroneous and are marked accordingly in the map. Only at the erroneously detected fifth word is it possible to carry out a check to determine whether a signature and therefore a systematic error is present. If the check on the fifth erroneous word results in it being found that a signature is present, the five words can be marked as a "systematic error" in the map. The map assists in discovering that errors were already present and, if appropriate, which errors they were.

The memory area can be part of a coherent or a distributed physical memory. The memory area can be distributed over one or more memory locations and/or memory chips. The memory area can have a multiplicity of memory cells. The memory cell can be a logical memory cell that forms the basis for at least one physical memory cell. By way of example, there can be provision for differential memories in which more than one physical memory cell represents the state of a logical memory cell. Alternatively, the logical memory cell (the entry in the memory area) can be reflected by a single memory cell.

It is an option, during the static test, to count: how often an erased word was detected (i.e. how often the state 0000 was detected), how often a correct word was detected (i.e. how often the state 0111 was detected), how often a correctable error was present (i.e. how often the state 0001 and/or the state 0010 was/were detected), and/or how often an uncorrectable error was present (i.e. how often the state 0011 was detected). This count information can be used to make a statement regarding the state of the memory area.

The information stored in the map can be used to store test results, to ascertain changes (e.g. deteriorations) in the test results, to specifically carry out further tests and/or to identify erroneous memory parts.

In particular, it is possible to note a gradual deterioration in the memory state as a result of the change in the test results and to initiate appropriate countermeasures (e.g. blocking of erroneous memory areas, replacement of memory modules or devices having memory modules) in good time.

By way of example, the map described herein can be used to derive and possibly also compress test results for the memory area. As such, a traffic light representation could be used to combine the state of the memory area and/or a forecast for a predefined future period of time:

If the traffic lights are on red, urgent measures for dealing with an erroneous memory area may be necessary.

If the traffic lights are on amber, the memory area already exhibits erroneous words and possibly an increase in deterioration, operation of the memory still being ensured on the basis of the error correction. In this case, measures to change/restore the memory area or the device comprising the memory may be due.

If the traffic lights are on green, the memory area is working within the framework of the stipulations (e.g. a predefined number of correctable 1-bit errors can be accepted); no measures may be necessary.

Instead of the traffic light representation, any information, e.g. a value, can be used to represent the state of the memory area. The information can be combined for a plurality of memory areas as appropriate. This can in particular be advantageous for a physical memory comprising multiple memory areas.

It is also possible for such information to be produced after each test and for (if appropriate only) this compressed information to be evaluated for a predefined number of past tests (or all past tests) in order to detect a deterioration in the memory area (or in the entire memory). Details relating to the present state of the memory area (or memory) can then be taken from the last (current) test in each case. Gradual deteriorations in the memory area (memory) are therefore compressed, become efficiently evaluable and if appropriate also become comparable.

One option is furthermore for the information (this also applies to the compressed information, as do the explanations below) to be stored or transferred such that it is protected against undesirable modification or inspection. By way of example, the information can be provided with protection (e.g. read and/or write protection) and/or stored or transferred in encrypted form.

Furthermore, the information can be signed (e.g. by means of a check code or certificate) and in this way the authenticity of the information obtained can be verified, for example, after transmission.

It is also possible for processing (read processing, store processing and/or processing relating to the transmission) of the information to be carried out by an instance that files the protected (e.g. encrypted and/or certified) information in a memory (e.g. the DSRAM cited at the outset) for further processing. By way of example, this instance can access a protected memory in order to process the information and to store it in the DSRAM in processed form. This instance can be a security module and in particular integrated in a computer, for example.

By way of example, the security module can access a non-publicly accessible memory in order to generate a signature and/or to carry out an encryption. The non-publicly accessible memory can be part of a user configuration block (UCB).

The protection can be set (activated or deactivated) by a user. In particular, this can also be done for different types of protection individually. The setting itself can be password protected. A user can be a producer of the application, a producer of the hardware or a supplier of the chip, for example.

In particular, the embodiments described here are suitable for use in connection with software updates carried out via the air interface (SOTA). As such, it is possible to determine whether a memory area is suitable for an update that has gone live, or possibly needs to be replaced or repaired, before a final programming. Furthermore, after programming has been performed, the error state of the memory can be determined and also repeatedly checked at predefined times in order to be able to initiate countermeasures in good time in the event of an imminent deterioration in the memory. This is particularly advantageous from the point of view of safety, e.g. when applied in control units of motor vehicles.

Although embodiments of the present disclosure have been illustrated and described more thoroughly in detail by means of the at least one example embodiment shown, the disclosure is not limited thereto, and other variations can be derived therefrom by a person skilled in the art without departing from the scope of protection of the disclosure.

What is claimed is:

1. A method for testing a memory area, the method comprising:
   determining a source address based on a static test, wherein the static test is used to determine a static error state, and wherein the static test comprises determining whether a word at an address in the memory area is an erased word or not an erased word:
entering, in a map, the static error state and whether the word at the address in the memory area is an erased word or not an erased word;
jumping from a destination address to the source address;
reading a data word at the source address after jumping to the source address; and
examining the data word.

2. The method of claim 1, wherein determining the source address based on the static test comprises determining a source address for which the static test has revealed that there is no erased data word present in the source address.

3. The method of claim 1, wherein examining the data word comprises detecting for errors in the data word and determining whether the data word is correct, has a correctable error, or has an uncorrectable error.

4. The method of claim 1, further comprising:
jumping from the source address to the destination address before jumping from the destination address to the source address.

5. The method of claim 1, wherein examining the data word comprises determining whether the data word is a code word of an error code.

6. The method of claim 1, wherein examining the data word comprises determining a dynamic error state of the data word.

7. The method as claimed in claim 1, wherein the data word has a predefined static error state.

8. The method as claimed in claim 1, wherein the method is carried out based on information stored in the map and wherein a result of the method is entered in the map.

9. The method of claim 1, wherein the method is carried out for multiple data words in the memory area and the method is taken as a basis for determining a state of the memory area.

10. The method as claimed in claim 9, wherein the method is taken as a basis for producing a forecast for a change in the state of the memory area.

11. The method of claim 10, wherein the state of the memory area or the change in the state of the memory area is taken as a basis for initiating a predefined measure.

12. The method of claim 1, wherein multiple destination addresses are used as jump destinations for each source address.

13. The method of claim 1, further comprising:
determining the destination address based on inverting at least one bit of the source address.

14. The method of claim 1, wherein the destination address is an address at which an unerased word is stored.

15. The method of claim 1, wherein the method is carried out for multiple source addresses in the memory area.

16. An apparatus for testing a memory area, the apparatus configured to perform a method, the method comprising:
determining a source address based on a static test;
jumping from a destination address to the source address;
reading a data word at the source address after jumping to the source address from the destination address;
determining a dynamic error state of the data word after jumping to the source address from the destination address;
entering, in a map, a first value indicating the dynamic error state of the data word;
performing the static test, the static test including determining whether the data word is an erased word or not an erased word and determining a static error state of the data word; and
entering, in the map, a second value indicating the static error state of the data word.

17. The apparatus of claim 16, wherein the first value indicates whether the data word at the source address is correct, has a correctable error, or has an uncorrectable error after jumping to the source address from the destination address.

18. A method for testing a memory area, the method comprising:
reading a first data word at a first address;
determining whether the first data word is an erased data word or not an erased data word;
determining a static error state of the first data word after determining that the first data word is not an erased data word, wherein the static error state indicates whether the first data word is correct or includes an error;
entering a first non-zero value in a map, the first non-zero value indicating the static error state of the first data word;
performing a first jump from the first address to a second address;
performing a second jump from the second address to the first address after the first jump is performed;
determining a dynamic error state of the first data word after the second jump is performed, wherein the dynamic error state indicates whether the first data word is correct or has an error after the second jump is performed; and
entering a second value in the map, the second value indicating the dynamic error state of the first data word.

19. The method of claim 18, further comprising:
reading a second data word at a third address;
determining whether the second data word is an erased data word or not an erased data word; and
entering a null value in the map after determining that the second data word is an erased data word.

* * * * *